(12) United States Patent
Ono et al.

(10) Patent No.: US 6,551,947 B1
(45) Date of Patent: Apr. 22, 2003

(54) METHOD OF FORMING A HIGH QUALITY GATE OXIDE AT LOW TEMPERATURES

(75) Inventors: Yoshi Ono, Camas, WA (US); Jong-Jan Lee, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/164,919

(22) Filed: Jun. 4, 2002

(51) Int. Cl.[7] .......................... H01L 21/31; H01L 21/469
(52) U.S. Cl. .................... 438/770; 438/771; 438/772
(58) Field of Search ............................ 438/770–772

(56) References Cited

U.S. PATENT DOCUMENTS

| | | | |
|---|---|---|---|
| 6,287,988 B1 * | 9/2001 | Nagamine et al. | 438/765 |
| 2002/0009899 A1 * | 1/2002 | Shiramizu | 438/770 |
| 2002/0090776 A1 * | 7/2002 | Nakata et al. | 438/216 |

OTHER PUBLICATIONS

Ishikawa et al., *Low Temperature Thermal Oxidation of Silicon in $N_2O$ by UV irradiation*, Jpn. J. of Appl. Phys., 28, L1453 (1989).

Nayer et al., *Atmospheric Pressure, Low Temperature (<500° C.) UV/Ozone Oxidation of Silicon*, Electronics Letters, 26, 205 (1990).

Hirayama et al., *Low Temperature Growth of High–Integrity Silicon Oxide Films by Oxygen Radical Generated in High–Density Krypton Plasma*, IEDM Tech. Dig. p249, (1999).

Saito et al., *Advantage of Radical Oxidation for Improving Reliability of Ultra–Thin Gate Oxide*, 2000 Symposium on VLSI Technology, T18–2, (2000).

* cited by examiner

*Primary Examiner*—Phat X. Cao
*Assistant Examiner*—Thao X. Le
(74) *Attorney, Agent, or Firm*—David C. Ripma; Matthew D. Rabdau; Scott C. Krieger

(57) ABSTRACT

A method of low-temperature oxidation of a silicon substrate includes placing a silicon wafer in a vacuum chamber; maintaining the silicon wafer at a temperature of between about room temperature and 350° C.; introducing an oxidation gas in the vacuum chamber including introducing an oxidation gas taken from the group of oxidation gases consisting of $O_2$ and $O_3$; dissociating the oxidation gas into radical oxygen with a xenon laser generating light at a wavelength of about 172 nm and flowing the radical oxygen over the silicon wafer; and forming an oxide layer on at least a portion of the silicon wafer.

13 Claims, 2 Drawing Sheets

METHOD OF FORMING A HIGH QUALITY GATE OXIDE AT LOW TEMPERATURES

RELATED APPLICATIONS

This application is related to Ser. No. 10/164,924, filed Jun. 4, 2002, for Method for low temperature oxidation of silicon.

FIELD OF THE INVENTION

This invention relates to the fabrication of integrated circuits on silicon, and specifically to the provision of a low temperature, high quality silicon dioxide layer formed from the oxidation of silicon.

BACKGROUND OF THE INVENTION

Conventional techniques for oxidation of silicon require high temperatures, e.g., greater than 800° C., for long periods of time in an oxidizing ambient such as $O_2$, $N_2O$, or NO. During such oxidation, diffusion of elements occurs within the substrate, and fabrication sequences must be tailored to accommodate such diffusion. The ability to perform an oxidation at much lower temperatures, without sacrificing the quality, is a tremendous benefit to the semiconductor industry.

Thermal oxidations have different oxidation rates, depending on silicon crystal orientation. A 30 nm silicon oxide layer is grown in one hour at 900° C. in a dry $O_2$ ambient on silicon (111) whereas it only grows to about 21 nm on silicon (100) in the same amount of time at the same temperature. In a wet oxidation at 900° C. for 1 hour, the thickness is approximately 215 nm on silicon (111), but only 150 nm on silicon (100). These differences are critical for an oxidation for shallow trench isolation.

High temperature oxidations are also know to cause stacking faults at the silicon interface and extensive annealing steps are required to minimize the impact of such faults on device performance. This adds to the time and cost of processing for gate oxide formation.

An acceptable method of oxidizing silicon at low temperatures for manufacturing purposes currently does not exist. There are known methods of oxidizing silicon at low temperatures, such as plasma oxidation or oxidation with a radial slot-line antennae, however, these methods produce large quantities of ions as well as radicals which can damage the silicon surface and degrade the oxide quality. Oxidation with ozone, or ozone with ultraviolet light, has been reported, but the resultant films were observed to be self-limiting in thickness.

Ozone may be photodissociated with ultra-violet light to generate oxygen radicals, however, the atmospheric pressure used in the system allows oxygen radicals to collisionally recombine to ozone. The results are thus severely handicapped by the lack of the reactive oxygen radicals. Nevertheless, enhanced oxidation rates and good stoichiometric oxide are achieved which are superior to the state-of-the-art processes. In the above-identified related patent application, Ser. No. 10/164,924, $O_2$, $N_2O$ or NO are photodissociated by a xenon excimer laser to produce the oxygen radical O(1D), or $O^-$ ions.

Ishikawa et al., *Low Temperature Thermal Oxidation of Silicon in $N_2O$ by UV irradiation*, Jpn. J. of Appl. Phys., 28, L1453 (1989), disclose photodissociation of $N_2O$ with ultraviolet light at temperatures between 200° C. and 500° C.

In Nayer et al., *Atmospheric Pressure, Low Temperature (<500° C.) UV/Ozone Oxidation of Silicon*, Electronics Letters, 26, 205 (1990), an ultra thin oxide layer, approximately 40 Å thick, is formed on a silicon substrate by photodissociation of $O_3$ by ultra-violet light at temperatures below 500° C.

Hirayama et al., *Low Temperature Growth of High-Integrity Silicon Oxide Films by Oxygen Radical Generated in High-Density Krypton Plasma*, IEDM Tech. Dig. p249, (1999), describes oxides grown on silicon at approximately 400° C. by low ion bombardment and high plasma density.

Saito et al., *Advantage of Radical Oxidation for Improving Reliability of Ultra-Thin Gate Oxide*, 2000 Symposium on VLSI Technology, T18-2, (2000) describes formation of oxide with plasma oxidation with a radial slot line antennae.

SUMMARY OF THE INVENTION

A method of low-temperature oxidation of a silicon substrate includes placing a silicon wafer in a vacuum chamber; maintaining the silicon wafer at a temperature of between about room temperature and 350° C.; introducing an oxidation gas in the vacuum chamber including introducing an oxidation gas taken from the group of oxidation gases consisting of $N_2O$, NO, $O_2$ and $O_3$; dissociating the oxidation gas into radical oxygen with a xenon laser generating light at a wavelength of about 172 nm with a power of between about 3 mW/cm² to 20 mW/cm², and flowing the radical oxygen over the silicon wafer; and forming an oxide layer on at least a portion of the silicon wafer. The wafer may be further annealed at a temperature of between about 600° C. to 750° C. for between about one to ten minutes.

It is an object of the invention to form an oxide layer on a silicon substrate at a temperature below 600° C.

Another object of the invention is to provide free oxygen radicals by photodissociation of $O_2$ or $O_3$ with a xenon excimer laser.

A further object of the invention is to provide a method of increasing oxide growth by the application of a small negative voltage to the silicon wafer.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The technique used in this invention is to generate large quantities of oxygen radicals on or near the surface of a silicon layer to be oxidized. The radicals are generated by the photolysis of either $O_2$, $O_3$, or a mixture of $O_2$ and $O_3$ in any proportion. The light source used here is a xenon excimer lamp that emits efficiently at a wavelength of about 172 nm, or 7.21 eV in energy, with a power of between about 3 mW/cm² to 20 mW/cm². The bonding energy for O—O is 5.2 eV, therefore, the photon energy is sufficient to cleave the bond generating a pair of atomic oxygen radicals. In ozone ($O_3$), the bond between $O_2$—O is much weaker is broken more readily. Meanwhile, the ionization potentials of $O_2$ and $O_3$ are 12.06 eV and 12.3 eV, respectively, so the photon energy is insufficient to generate ions from the ground electronic state species in the gas phase. The ionization potential of an oxygen atom is 13.62 eV so ion generation from atomic oxygen is unlikely. It is well known that ozone preferentially adsorbs onto silica surfaces when a $O_2/O_3$ mixture is flowed, enabling the generation of higher concentration or nearly pure $O_3$ flows.

The work function of silicon is approximately 4.9 eV, therefor, a photon energy of 7.2 eV will eject electrons with an energy of 2.3 eV. These electrons are readily captured by the high concentration of ozone on the wafer surface, which breaks into $O_2$ and $O^-$. The $O^-$ ions are reported to be highly reactive with silicon. Applying a potential on the wafer surface through the wafer chuck allows one to control the energy of the photoelectrons. A negative potential will raise the necessary photon energy required while a negative potential will increase the photoelectron energy. An increase in the oxidation rate may result from the proper biasing of the wafer chuck to maximize the dissociative electron attachment cross section of $O_3$ to from $O^-$.

The Si—Si bond strength in the crystal lattice is about 3.5 eV, so the ultraviolet light in the intense vacuum will break bonds and generate a thin amorphous silicon layer near the oxide to-silicon interface. The Si—O bond is 8.3 eV, which are not broken by the light. The thin amorphous layer, if not recrystallized, will impede carrier mobility so that device performance will be compromised. A short, e.g., one to ten minute, anneal at between about 600° C. to 750° C. in an inert gas ambient atmosphere is sufficient to recrystallize the silicon and restore the high carrier mobility.

Figure 1:
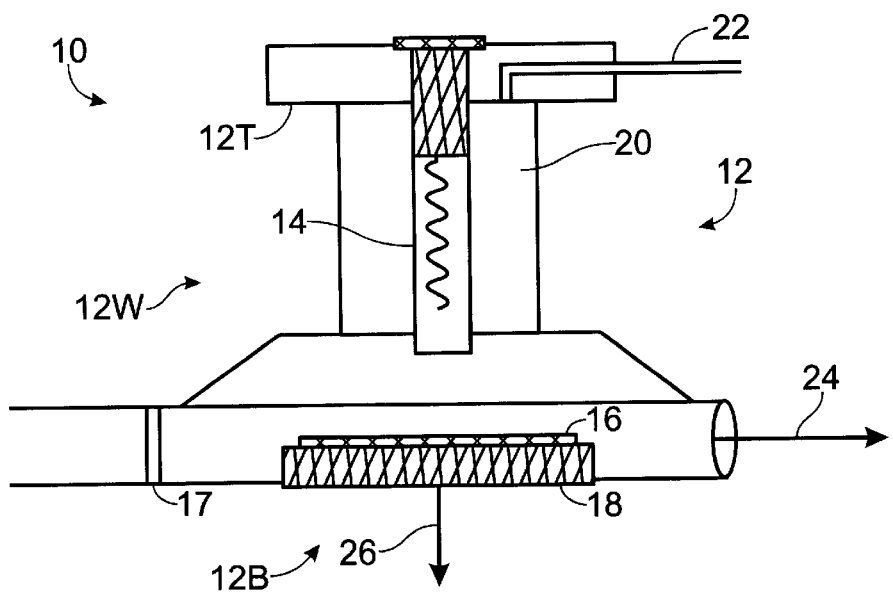
FIG. 1 is a schematic representation of the apparatus used to achieve the low temperature oxidation.

The apparatus of the method of the invention is depicted in FIG. 1, generally at 10. Apparatus 10 includes a vacuum chamber 12, having a xenon excimer lamp 14 located therein, which lamp emits light at a wavelength of about 172 nm. Lamp 14 is placed in vacuum chamber 12 above the surface of a silicon wafer 16 that is to be at least partially oxidized. Wafer 16 may be patterned to provide oxidation of specific regions thereof, or the entire wafer may be oxidized, thus, wafer 16 may comprise a silicon substrate. Wafer 16 is placed in chamber 12 through a load-lock 17. Wafer 16 is held in place in a wafer-holding chuck 18. The materials used to construct this vacuum chamber may be anodized aluminum, stainless steel, quartz, glass, ceramics and other materials not normally used in silicon oxidation technology. Chamber 12 has a Teflon® top surface 12T, and anodized aluminum walls 12W and bottom 12B. Lamp 14 is located in a ceramic cylinder 20. Oxidation gas, $O_2$ or $O_3$ being the preferred oxidation gas, is introduced into chamber 12 through an inlet manifold 22, at a flow rate of between about 2 sccm to 50 sccm, and is removed from chamber 12 by a throttle valve and turbo pump 24, which maintains chamber pressure in a range of between about 40 mTorr. to 90 mTorr. Lamp 14 is a source for producing a large flux of photons. The photons are believed to initiate the oxidation of silicon through 1) dissociation of the oxidation gas to form O(3P) and O(1D) radicals and/or 2) ejection of photoelectrons from the silicon surface, which electrons reacts with the oxidation gas to form $O^-$ ions in a region adjacent to the silicon wafer.

In the case where of an oxidation performed at less than 400° C., the impurity diffusion is negligible. This allows oxidation on things such as plastic substrates. The xenon excimer lamp is a relatively low-cost, commercially available product, e.g., Xeradex™ lamp produced by Osram Sylvania.

During oxidation, a steady flow of oxidation gas is introduced into the chamber and the pressure is controlled by a throttle valve between the chamber and the pump system. The $O_2$ is dissociated by the photons from lamp 14, generating the radical oxygen atom O(1D). The radical oxygen then reacts with the silicon wafer to produce an oxide region. The wafer sits on chuck 18, which is capable of generating temperatures therein of up to about 400° C. Because of the design of chuck 18, the wafer does not reach the same temperature as the chuck. The temperature offset can be as high as 160° C. at a chuck set point of 400° C. Thus, wafer 16 may be held at a temperature of between about room temperature and 400° C. during oxidation, but may have a high temperature as low as 240° C.

A small positive potential is sufficient to significantly slow the oxidation. By experimentation, it was established that a small negative potential was sufficient to accelerate oxidation. A silicon wafer was electrically floated (insulated) from the chuck bias, which builds up a positive potential during the ejection of photoelectrons. When the silicon wafer is electrically grounded, creating a neutral potential, the oxidation process was observed to increase. Application of a negative potential increased both the photoelectron energy and quantity, both of which can contribute to enhance the oxidation rate.

For a standard ten minute oxidation process, a layer of oxide having a thickness of 31 Å was formed when the silicon wafer was grounded to the wafer chuck. An oxide layer of 15 Å thickness was formed under the same time and conditions when the silicon wafer was insulated from the wafer chuck. The probability of an $O_3$ reaction an electron to form $O_2$ and $O^-$ is known to increase with the electron energy until the electron energy reaches 9 eV. When the silicon wafer is grounded, the electron energy is only 2.3 eV. A negative bias of about 5–10 volts, 26, produced an adequate negative potential to accelerate the oxide grow, allowing the ten minute oxidation process to be completed in between about three to four minutes.

Figure 2:
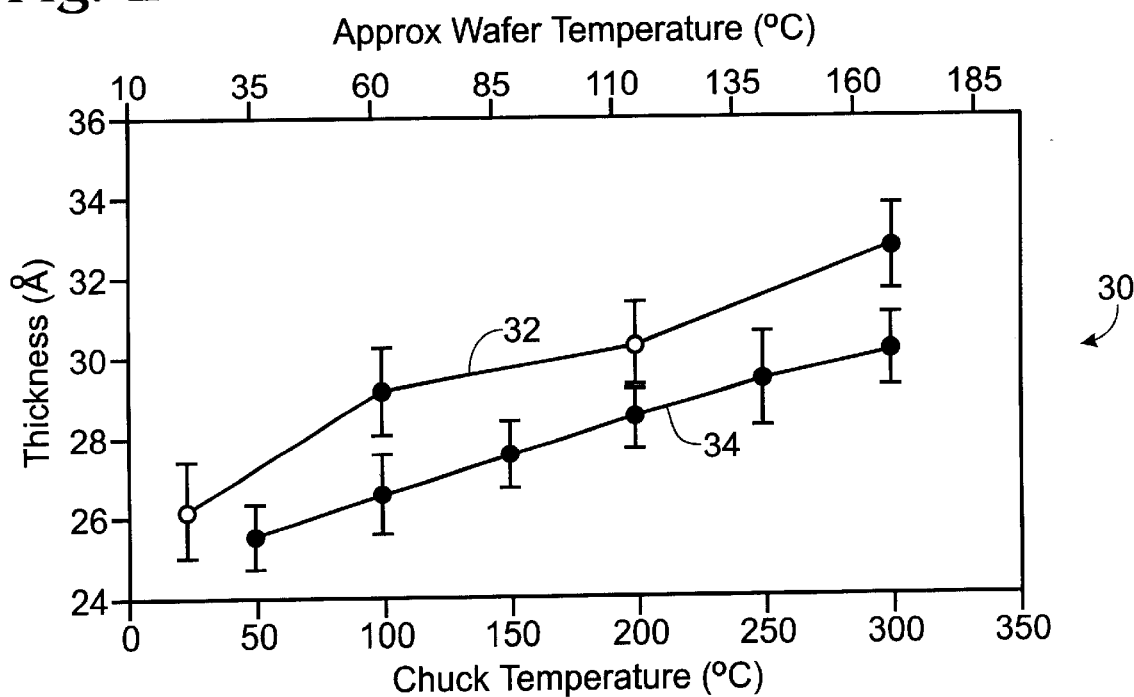
FIG. 2 is a graph of oxide thickness as a function of chuck temperature for $O_2$ vs $N_2O$.

The amount of the oxygen near the wafer surface is dictated by the density of $O_2$ and $O_3$ in the vacuum chamber, the total pressure in the chamber, and the photolyzing light intensity near the surface. Oxidation with $O_2$ is more efficient than oxidation with $N_2O$, probably because $N_2O$ produces one oxygen atom per molecule, while $O_2$ can produce two atoms per molecule. The resulting oxide thickness does not scale with the expected oxygen radical concentration, thus it is believed that the oxidation rate is near the saturation point at the substrate surface. The thickness comparison as a function of chuck temperature is depicted in FIG. 2, generally at 30. The oxidation of silicon with the oxygen radical is not highly temperature dependent, and substantial oxides are generated even at room temperature. At elevated temperatures, a small enhancement to the oxidation rate is seen. Trace 32 is the result of a 4 sccm $O_2$ flow at a chamber pressure of 50 mTorr. for ten minutes. Trace 34 is the result of a 10 sccm $N_2O$ flow at a chamber pressure of 50 mTorr. for ten minutes.

Figure 3:
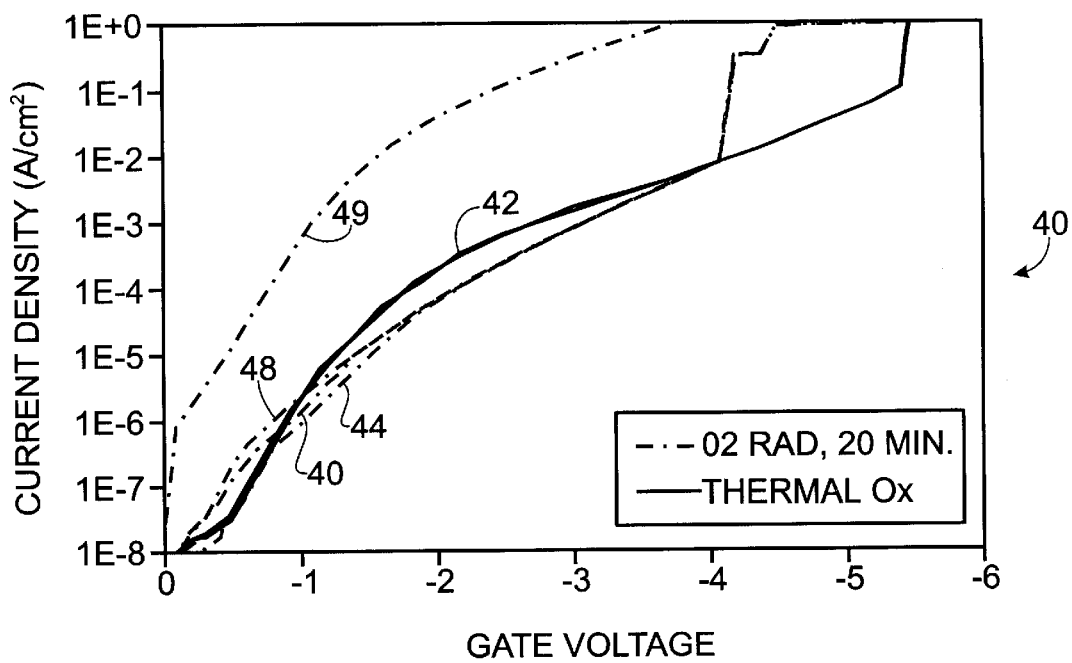
FIG. 3 is a graph comparing J-V characteristics for radical oxides compared to thermal oxides.
Figure 4:
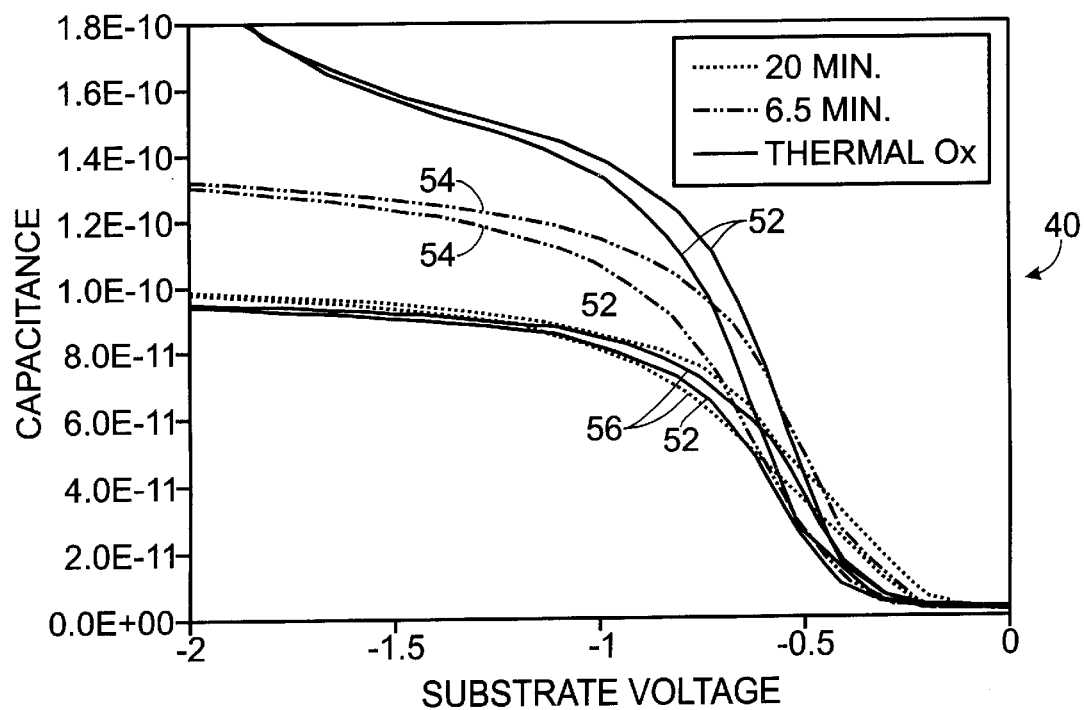
FIG. 4 is a graph comparing bidirectional C-V characteristics for radical oxides compared to thermal oxides.

The quality of the thin oxide film was compared to thermal oxides for gate oxide applications. Simple capacitor structures were fabricated to determine bulk charge trapping, interface trapping, and breakdown characteristics. The oxidations were performed on p-type prime wafers with sputtered TiN gates that were patterned and etched. A forming gas anneal was performed at 450° C. After an HF etch to remove any backside oxide, the electrical measurements owere performed. The J-V characteristics of the as measured prior to forming gas anneal are shown in FIG. 3, generally at 40. Trace 42 is the results of conventional thermal oxidation, while traces 44, 46, 48 and 49 are the result of the method of the invention with an $O_2$ oxidation gas and oxygen radical for twenty minutes. Sequential scans of 0 to −3 volts, 0 to −4 volts, 0 to −5 volts and 0 to −6 volts were performed to determine the effects of stress induced leakage current (SILC). In this as-fabricated condition, the radical oxide showed signs of greater SILC, but lower leakage at slightly higher fields. After forming gas anneal, a thin $TiO_2$ layer formed on the TiN gate, making it difficult to get accurate J-V characteristics. The post FGA C-V curves are shown in FIG. 4, generally at 50. The chamber was equipped with a single lamp, held at a pressure of about 50 mTorr., at temperature of about 300° C. Trace 52 is for conventional thermal oxidation, while traces 54 are for a 6.5 minute oxidation and traces 56 are for a 20 minute oxidation. The results are from 100 μm×100 μm capacitors. These were obtained by bidirectional scans between −3 volts and 1 volt. Charge trapping is seen as hysteresis in the CV scans. The radical oxide demonstrates hysteresis magnitudes similar to thermal oxides, whereas the $N_2O$ radical oxides were obviously larger.

With the advancement in excimer lamp technology, the use of alternate wavelengths may be possible. Other excimers produce light at 126 nm, 146 nm, 222 nm, and 308 nm but these are probably not as efficiently as the xenon excimer operating at 172 nm.

Alternate oxygen sources are possible. The use of $N_2O$ has been disclosed in one of the above identified related applications. Other possible candidates are $H_2O$, $H_2O_2$, CO, $H_2CO$, and $CO_2$, however, the carbon-containing compounds are unlikely candidates because they will likely produce carbon contamination.

Thus, a method and system for low temperature oxidation of silicon using radicals generated from oxygen and ozone has been disclosed. It will be appreciated that further variations and modification thereby may be made within the scope of the invention as defined in the appended claims.

We claim:

1. A method of low-temperature oxidation of a silicon substrate comprising:

placing a silicon wafer in a vacuum chamber;

maintaining the silicon wafer at a temperature of between about room temperature and 350° C.;

introducing an oxidation gas in the vacuum chamber;

dissociating the oxidation gas into radical oxygen with a xenon laser generating light at a wavelength of about 172 nm and flowing the radical oxygen over the silicon wafer while applying a negative potential of between about five to ten volts to the silicon wafer; and forming an oxide layer on at least a portion of the silicon wafer.

2. The method of claim 1 which further includes maintaining the vacuum chamber at a pressure of between about 40 mTorr. and 90 mTorr.

3. The method of claim 1 wherein said introducing an oxidation gas in the vacuum chamber includes providing a gas flow rate of between about 2 sccm and 50 sccm.

4. The method of claim 1 wherein said introducing an oxidation gas in the vacuum chamber includes introducing an oxidation gas taken from the group of oxidation gases consisting of $O_2$ and $O_3$.

5. The method of claim 1 which includes, after said forming, annealing the silicon wafer and oxide layer in an inert atmosphere for between about one to ten minutes at a temperature of between about 600° C. to 750° C.

6. A method of low-temperature oxidation of a silicon substrate comprising:

placing a silicon wafer in a vacuum chamber;

maintaining the silicon wafer at a temperature of between about room temperature and 350° C.;

introducing an oxidation gas in the vacuum chamber including introducing an oxidation gas taken from the group of oxidation gases consisting of $O_2$ and $O_3$;

dissociating the oxidation gas into radical oxygen with a xenon laser generating light at a wavelength of about 172 nm and flowing the radical oxygen over the silicon wafer while applying a negative potential of between about five to ten volts to the silicon wafer; and forming an oxide layer on at least a portion of the silicon wafer.

7. The method of claim 6 which further includes maintaining the vacuum chamber at a pressure of between about 40 mTorr. and 90 mTorr.

8. The method of claim 6 wherein said introducing an oxidation gas in the vacuum chamber includes providing a gas flow rate of between about 2 sccm and 50 sccm.

9. The method of claim 6 which includes, after said forming, annealing the silicon wafer and oxide layer in an inert atmosphere for between about one to ten minutes at a temperature of between about 600° C. to 750° C.

10. A method of low-temperature oxidation of a silicon substrate comprising:

placing a silicon wafer in a vacuum chamber;

maintaining the silicon wafer at a temperature of between about room temperature and 350° C.;

introducing an oxidation gas in the vacuum chamber;

dissociating the oxidation gas into radical oxygen with a xenon laser generating light at a wavelength of about 172 nm and flowing the radical oxygen over the silicon wafer, and applying a negative potential of between about five to ten volts to the silicon wafer;

forming an oxide layer on at least a portion of the silicon wafer; and annealing the silicon wafer and oxide layer in an inert atmosphere for between about one to ten minutes at a temperature of between about 600° C. to 750° C.

11. The method of claim 10 which further includes maintaining the vacuum chamber at a pressure of between about 40 mTorr. and 90 mTorr.

12. The method of claim 10 wherein said introducing an oxidation gas in the vacuum chamber includes providing a gas flow rate of between about 2 sccm and 50 sccm.

13. The method of claim 10 wherein said introducing an oxidation gas in the vacuum chamber includes introducing an oxidation gas taken from the group of oxidation gases consisting of $O_2$ and $O_3$.

* * * * *